United States Patent [19]

Remedi

[11] 4,176,287
[45] Nov. 27, 1979

[54] VERSATILE CMOS DECODER

[75] Inventor: James J. Remedi, Austin, Tex.

[73] Assignee: Motorola, Inc., Schaumburg, Ill.

[21] Appl. No.: 896,071

[22] Filed: Apr. 13, 1978

[51] Int. Cl.² .................. H03K 17/60; H03K 5/18; H03K 13/00
[52] U.S. Cl. .................. 307/251; 307/205; 307/DIG. 5; 340/347 DD
[58] Field of Search .......... 307/205, 251, DIG. 5; 328/119; 340/347 DD; 365/230, 231

[56] References Cited

U.S. PATENT DOCUMENTS

| | | | |
|---|---|---|---|
| 3,766,408 | 10/1973 | Suzuki et al. | 307/279 X |
| 3,784,978 | 1/1974 | Zola | 307/DIG. 5 X |
| 3,873,851 | 3/1975 | Weimer | 307/DIG. 5 X |
| 3,896,429 | 7/1975 | Moyer et al. | 307/DIG. 5 X |
| 3,984,703 | 10/1976 | Jorgensen | 307/205 X |
| 3,989,955 | 11/1976 | Suzuki | 307/205 |
| 4,021,656 | 5/1977 | Caudel et al. | 307/DIG. 5 X |
| 4,103,349 | 7/1978 | Marmet | 328/119 X |
| 4,104,735 | 8/1978 | Hofmann et al. | 307/205 X |

FOREIGN PATENT DOCUMENTS

| | | | |
|---|---|---|---|
| 2296966 | 7/1976 | France | 307/205 |

OTHER PUBLICATIONS

*Electronics* (pub.); "COS/MOS: The Best of Both Worlds", pp. 109–112, 2/17/1969; author Herzog.
Kenyon et al., "Complementary Field-Effect Transistor High-Density Decoder", IBM Tech. Discl. Bull., pp. 2823–2824; vol. 15, No. 9, 2/1973.

*Primary Examiner*—Larry N. Anagnos
*Attorney, Agent, or Firm*—Joe E. Barbee

[57] ABSTRACT

A CMOS decoder capable of providing a one of n, a two of n, or a three of n decoded output, where n is equal to the number of outputs of the decoder and is a function of the number of bits in a digital signal to be decoded. A first plurality of transistors are used to precharge each of the decoder's outputs to a first voltage potential. A second plurality of transistors are placed in series between the first node and each of the outputs. The second plurality of transistors are controlled by the coded digital signal that is being decoded. The number of decoded outputs can be varied by connecting some of the outputs to some of the transistors of the second plurality of transistors or by connecting others of the outputs to junctions formed by the series placed transistors. In a preferred embodiment, a pair of back-to-back inverters are connected to each of the outputs to provide a static decoder.

13 Claims, 3 Drawing Figures

FIG. 3

VERSATILE CMOS DECODER

BACKGROUND OF THE INVENTION

This invention relates, in general, to digital decoders for decoding digital signals and more particularly, to a CMOS decoder capable of providing one or more of n decoded outputs.

Decoders for decoding digital signals are widely used in digital systems. A digital signal can contain a group of digital bits. A message can be encoded by the group of digital bits by using a combination of the presence or absence of the digital bits. Both states, true and complement, of the digital bit is used to convey meaningful information. Decoders allow the translation of one logic word structure into another logic word structure while conserving the same information content. A decoder is often used to extract information from a complex signal. The decoder converts coded information into a more usable form.

Two digital bits can be decoded to obtain four different and distinct outputs. Three digital bits can be decoded to provide eight different outputs while four coded digital bits can provide sixteen different decoded outputs, etc., etc.

In the past, digital decoders have been rather complex and employ a great number of transistors. It is highly desirable that a decoder be small in size, yet provide fast operation, and consume a minimum amount of power.

Accordingly, it is an object of the present invention to provide a decoder of low power consumption in a minimum amount of transistors.

Another object of the present invention is to provide a versatile decoder readily adaptable for providing x of n decoded outputs where x can be any number between 1 and n, and n is the number of outputs of the decoder.

SUMMARY OF THE INVENTION

In carrying out the above and other objects of the invention in one form, there is provided an improved digital decoder having a plurality of outputs. A first plurality of transistors are each coupled to one of the outputs to controllably precharge the output to a first potential. A controllable means is coupled between a first node and a second voltage potential to provide a controllable precharge to the first node. A second plurality of transistors are coupled between the first node and the outputs of the decoder. The second plurality of transistors are controlled by bits in the digital signal to be decoded. The number of decoded outputs provided can be varied by coupling the outputs to the transistors which are controlled by the least significant bit or by coupling some of the outputs to transistors controlled by bits other than the least significant bit. A pair of inverters connected in a back-to-back configuration can be coupled to each of the outputs to provide a static output.

The subject matter which is regarded as the invention is set forth in the appended claims. The invention itself, however, together with further objects and advantages thereof, may be better understood by referring to the following detailed description taken in conjunction with the accompanying drawings.

BRIEF DESCRIPTION OF THE DRAWINGS

FIG. 3 is a truth table for the embodiment of FIG. 2.

The exemplifications set out herein illustrate the preferred embodiment of the invention in one form thereof, and such exemplifications are not to be construed as limiting in any manner.

DESCRIPTION OF THE PREFERRED EMBODIMENTS

Figure 1:
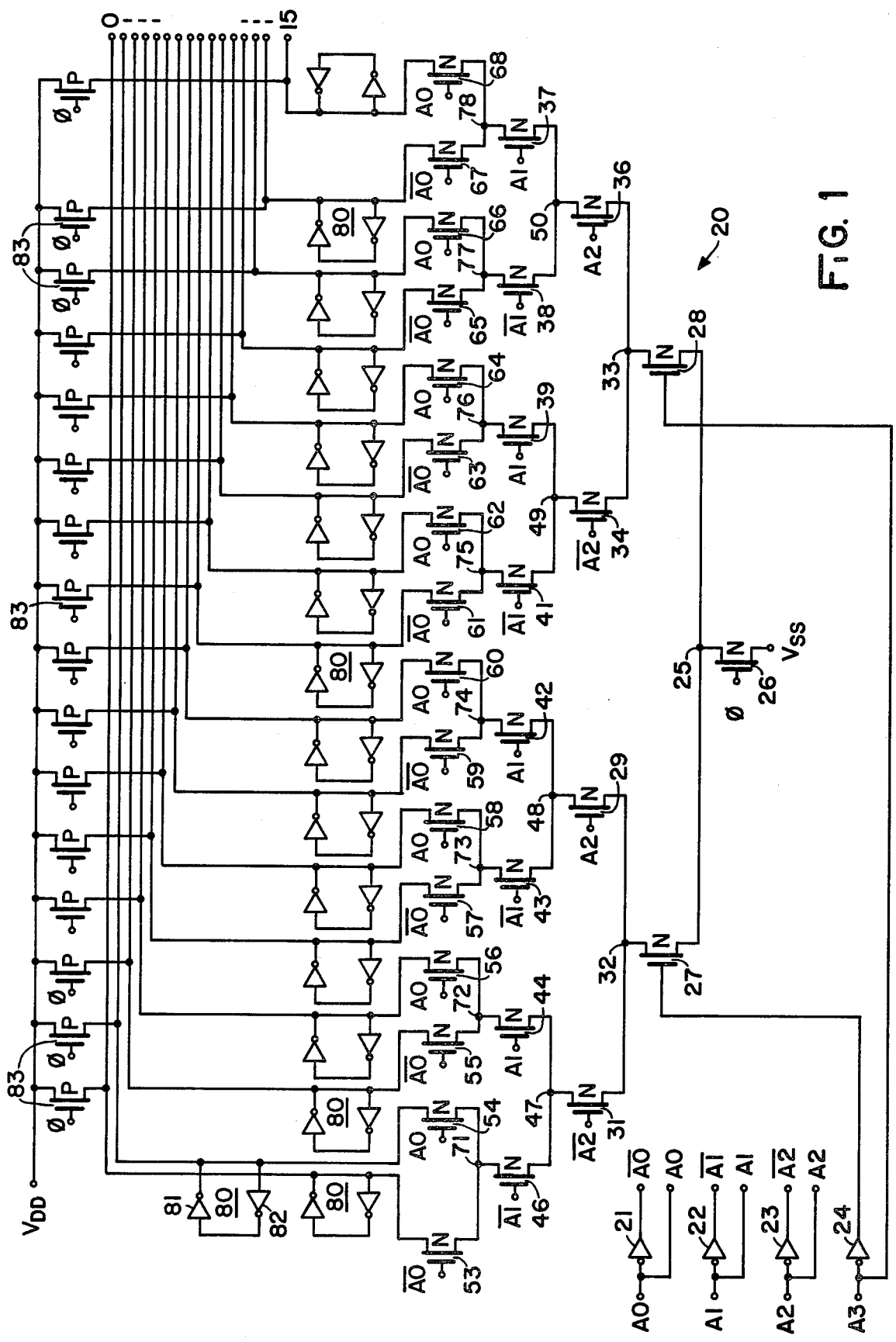
FIG. 1 illustrates a one of sixteen decoder embodying the invention in one form thereof.

FIG. 1 illustrates, mostly in schematic form, a CMOS decoder 20 having a plurality of outputs numbered 0 through 15 and inputs A0, A1, A2, and A3. Decoder 20 as illustrated is a one of sixteen decoder meaning that four digital inputs (A0, A1, A2, and A3) are used to provide one of sixteen possible outputs. Decoder 20 should be thought of as a one of n decoder wherein n is the number of outputs of the decoder which is a function of the number of inputs. Decoder 20 can be expanded to handle more inputs and provide more outputs or can be made smaller to handle less inputs and provide less outputs.

Each of the outputs 0 through 15 is coupled to voltage $V_{DD}$ by a P-channel field effect transistor 83. Transistor 83 is responsive or controlled by a clock signal $\phi$. When clock signal $\phi$ enables transistors 83, each of the outputs will be precharged to approximately voltage $V_{DD}$. A pair of back-to-back inverters 80 having individual inverters 81 and 82 are coupled to each of the outputs to maintain the outputs in a static condition. As an example, when the outputs are precharged to $V_{DD}$ this voltage will be inverted by inverter 82 and connected to the input of inverter 81. Inverter 81 in turn will invert the output of inverter 82. The inverted output of inverter 81 is connected back to the output thereby maintaining the output at precharge voltage $V_{DD}$. If decoder 20 is to be a dynamic decoder then of course all the pairs of back-to-back inverters 80 would be removed.

Input A0 is connected to inverter 21 to provide an output $\overline{A0}$. Input A1 is inverted by inverter 22 to provide $\overline{A1}$, input A2 is inverted by inverter 23 to provide $\overline{A2}$, and input A3 is inverted by inverter 24 to provide $\overline{A3}$. The inverters 21 through 24 provide, as an output, the complement of the input to the inverters. Input A3 is connected to the gate electrode of transistor 28 to provide control of transistor 28. The output of inverter 24 which is $\overline{A3}$ is connected to the gate electrode of transistor 27 to provide control of transistor 27. The sources of transistors 27 and 28 are connected to node 25, and node 25 is coupled to reference potential $V_{SS}$ by transistor 26. Transistor 26 is controlled or enabled by clock signal $\phi$. Transistor 26 is a precharging transistor to precharge node 25 to voltage $V_{SS}$. Node 25 is coupled to node 32 by transistor 27 and to node 33 by transistor 28. Transistors 26, 27 and 28 are all N-channel field effect transistors.

N-channel transistor 31 couples node 32 to node 47. Transistor 31 has its gate electrode connected to input $\overline{A2}$ to provide control of transistor 31. Node 32 is coupled to node 48 by N-channel transistor 29. N-channel transistor 29 has its gate electrode connected to input A2. N-channel transistor 34 couples node 33 to node 49 and N-channel transistor 36 couples node 33 to node 50.

Transistor 34 is responsive to input $\overline{A2}$ and transistor 36 is responsive to input A2. Each node 47 through 50 is in turn coupled to two other nodes. N-channel transistor 46 couples node 47 to node 71 and N-channel transistor 44 couples node 47 to node 72. Transistor 46 is controlled by input $\overline{A1}$ while transistor 44 is controlled by A1. Node 48 is coupled by N-channel transistor 43 to node 73 and coupled to node 74 by N-channel transistor 42. Transistor 43 is responsive to input $\overline{A1}$ while transistor 42 is responsive to A1. Node 49 is coupled to node 75 by N-channel transistor 41 and to node 76 by N-channel transistor 39. Transistor 41 is controlled by input $\overline{A1}$ while transistor 39 is controlled by A1. Node 50 is coupled to node 77 by N-channel transistor 38 and to node 78 by N-channel transistor 37. Input $\overline{A1}$ controls transistor 38 while input A1 controls transistor 37. Node 71 is coupled to output 0 by N-channel transistor 53 and to output 1 by N-channel transistor 54. Transistors 53 and 54 each have their sources connected to node 71 while their drains are connected to the outputs. The gate electrode of transistor 53 is connected to input $\overline{A0}$ while the gate electrode of transistor 54 is connected to A0. Node 72 is coupled to output 2 by N-channel transistor 55 and to output 3 by N-channel transistor 56. Transistor 55 is controlled by input $\overline{A0}$ while transistor 56 is controlled by input A0. Node 73 is coupled to output 4 by N-channel transistor 57 and to output 5 by N-channel transistor 58. Transistor 57 is controlled by input $\overline{A0}$ while transistor 58 is controlled by input A0. Node 74 is coupled to output 6 by N-channel transistor 59 and coupled to output 7 by N-channel transistor 60. Transistor 59 is controlled by input $\overline{A0}$ while transistor 60 is controlled by input A0. Node 75 is coupled to output 8 by N-channel transistor 61 and coupled to output 9 by N-channel transistor 62. Transistor 61 is controlled by $\overline{A0}$ while transistor 62 is controlled by input A0. Node 76 is coupled to output 10 by N-channel transistor 63 and coupled to output 11 by N-channel transistor 64. Transistor 63 is controlled by input $\overline{A0}$ while transistor 64 is controlled by input A0. Node 77 is coupled to output 12 by N-channel transistor 65 and coupled to output 13 by N-channel transistor 66. Transistor 65 is controlled by input $\overline{A0}$ while transistor 66 is controlled by input A0. Node 78 is coupled to output 14 by N-channel transistor 67 and also coupled to output 15 by N-channel transistor 68. N-channel 67 is controlled by input $\overline{A0}$ while transistor 68 is controlled by input A0.

As illustrated, input A0 is the least significant input. Input A0 and its complement $\overline{A0}$ are used to control transistors 53 through 68. Transistors 53 through 68 each have their drains connected to one of the outputs. Input A3 is the most significant input and it used to control transistor 28 while its complement, $\overline{A3}$, which is obtained from the output of inverter 24, is used to control transistor 27. Transistors 27 and 28 have their sources connected to the drain of transistor 26 to form node 25.

Because of the simplicity of the decoder the operation is easily understood. When clock signal $\phi$ goes low, P-channel transistors 83 are enabled while N-channel transistor 26 is inhibited. When P-channel transistors 83 are enabled all the outputs 0 through 15 are precharged to approximately voltage level $V_{DD}$. The pair of back-to-back inverters 80 which include inverters 81 and 82, will maintain the outputs at voltage $V_{DD}$. Now if it is assumed that all of the inputs A0 through A3 are at a low level then their complements $\overline{A0}$ through $\overline{A3}$ will be at a high level. The high level will enable each one of the N-channel transistors to which it is connected. Accordingly, N-channel transistors 27, 31, 46, and 53 will be enabled which provide a path between output 0 and node 25. When clock signal $\phi$ then goes high, transistor 26 is enabled and transistors 83 are disabled. Enabling transistor 26, precharges node 25 to voltage $V_{SS}$, and this voltage, $V_{SS}$, will appear on output 0 while all the other outputs remain at a level substantially equal to potential $V_{DD}$. Output 0 will be maintained at near the level of voltage $V_{SS}$ by virtue of the pair of back-to-back inverters 80 connected to it. Although the high level complement signals are also connected to other of the N-channel transistors it will be noted that these other N-channel transistors all appear in series with at least one of the N-channel transistors which is controlled by the true of the inputs, A0, A1, A2, or A3. Since the inputs A0 through A3 were assumed to be in a low state, they will not enable any of the transistors they control, and therefore, only one path is completed between node 25 and the outputs.

To take another example of how an input is decoded, assume that A0, A1, and A2 are all in a low state and A3 is in a high state. Since A3 is in a high state, its complement $\overline{A3}$ will be in a low state thereby not enabling transistor 27, while transistor 28 will be enabled. The only completed path between node 25 and an output will be transistors 28, 34, 41, and 61. This completed path serves to couple node 25 to output 8. Transistors 34, 41, and 61 are enabled by the complements $\overline{A0}$, $\overline{A1}$, and $\overline{A2}$ which would all be in a high state, assuming A0 through A2 are in a low state.

Figure 2:
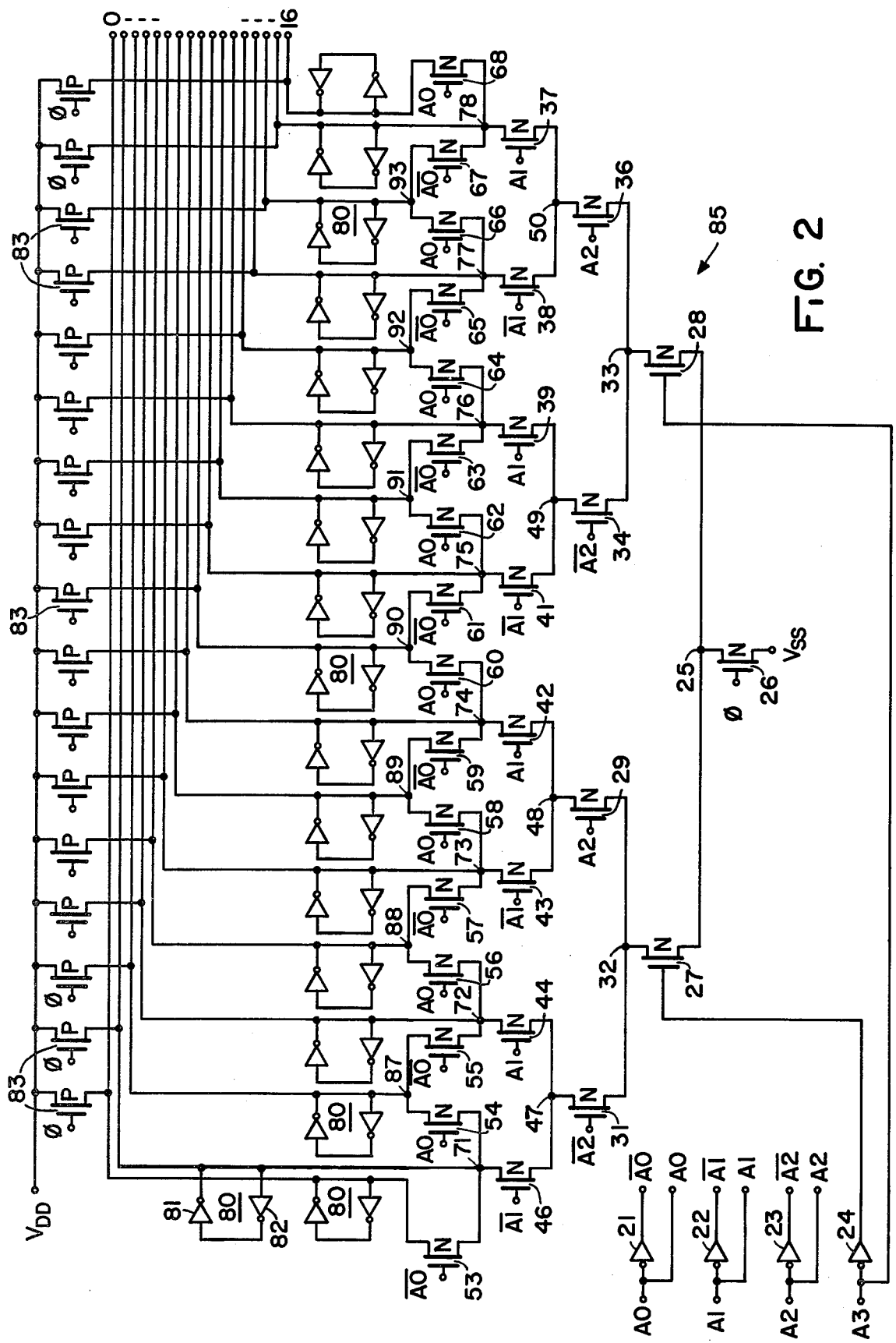
FIG. 2 illustrates another embodiment of the invention in a two of seventeen decoder.

FIG. 2 is an example of a two of n decoder using the present invention. The specific example illustrated is a two of 17 decoder. Since the example illustrated decodes a 4-bit input (A0, A1, A2, and A3), as does the example in FIG. 1, the decoders look very similar, and accordingly, the same reference numbers are used for common parts. The main difference in the arrangement of the decoders of FIG. 1 and FIG. 2 is that decoder 85 of FIG. 2 has an output connected to each of the nodes 71 through 78, and has a new set of nodes 87 through 93 which are also connected to outputs thus forming outputs 0 through 16 for decoder 85. Node 71 is connected to output 1, node 72 is connected to output 3, node 73 is connected to output 5, node 74 is connected to output 7, node 75 is connected to output 9, node 76 is connected to output 11, node 77 is connected to output 13, and node 78 is connected to output 15. Output 2 is connected to node 87, output 4 is connected to node 88, output 6 is connected to node 89, output 8 is connected to node 90, output 10 is connected to node 91, output 12 is connected to node 92, and output 14 is connected to node 93. Also connected to node 87 are the drains of transistors 54 and 55. The other nodes 88 through 93 are formed in a similar manner by being connected to the drain of the transistors controlled by the least significant bit. Output 0 is connected to the drain of N-channel transistor 53.

Figure 3:
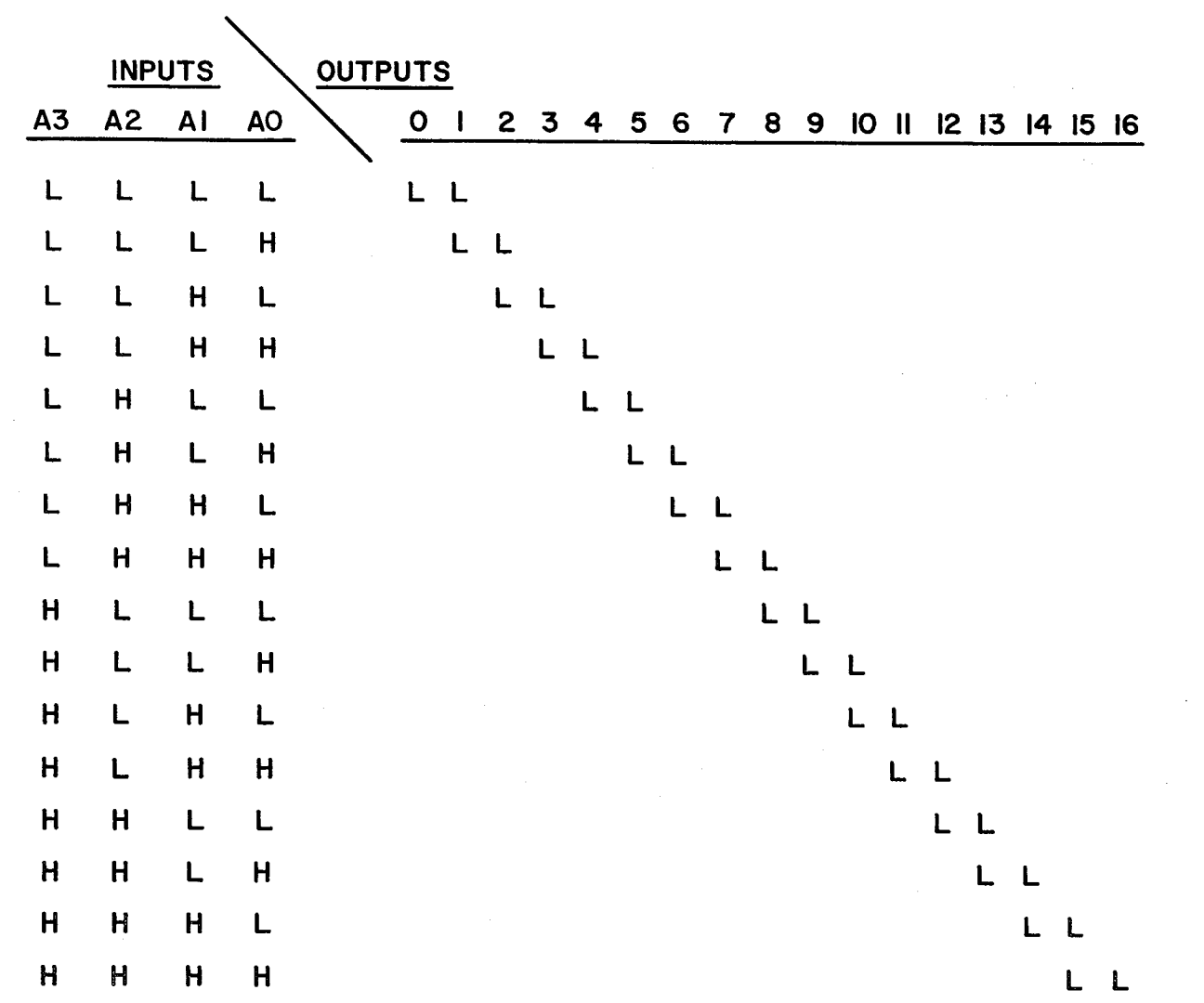

Decoder 85 operates in a similar manner to decoder 20. If we assume that inputs A0 through A3 of decoder 85 are at a logic low then the transistors connected to these inputs will not be enabled, however, the transistors connected to the complements $\overline{A0}$, $\overline{A1}$, $\overline{A2}$, and $\overline{A3}$ will be enabled. Accordingly, transistors 53, 46, 31, and 27 will all be enabled thereby coupling node 25 to outputs 0 and 1 at the same time. The precharging of course, is done in the same manner as for decoder 20 of FIG. 1. FIG. 3 is a truth table for decoder 85 of FIG. 2.

The L's and H's for address inputs A0 through A3 represent logic lows and highs, respectively. For each of the sixteen different inputs, two of the outputs will be logic lows, L, while the remainder of the outputs will remain at their precharged level.

Decoder 85 can be made a three of n decoder simply by using nodes 47 through 50 as outputs. Decoder 85 can be expanded to decode an input signal with more than 4-bits or can be made smaller to decode digital signals with less than 4-bits.

By way of example only, the following sizes of transistors for decoder 85 of FIG. 2 can be used to achieve satisfactory performance of the decoder for use as a page select for a read-only-memory. All P-channel transistors 83 can be 11/8 microns, which means the transistors can be eleven microns wide and 8 microns long. All the N-channel transistors can be 30/8 microns. Both the P and N-channel transistors used in inverters 82 and 6/8 microns, while the transistors in inverters 81 and 6/35 microns. Note that inverters 81 are very weak inverters thereby allowing any change on the decoder outputs to overcome or override inverters 81.

By now, it should be appreciated that there has been provided a versatile decoder using field effect transistors. The decoder uses a relatively small number of transistors and can provide a static output by adding back-to-back inverters to the output. Although the invention as described uses P-channel and N-channel field effect transistors it will be noted that all of one type channel transistors could be used simply by providing proper timing signals to transistors 26 and 83. The timing signal would have to be such that node 25 is not precharged at the same time as the outputs are being precharged. It is possible to change all the N-channel transistors to P-channel transistors, and all the P-channel transistors to N-channel transistors and then to interchange the $V_{DD}$ and $V_{SS}$ voltage terminals and still maintain the benefits of the present invention.

Consequently, while in accordance with the Patent Statutes, there has been described what at present is considered to be the preferred forms of the invention, it will be obvious to those skilled in the art that numerous changes and modification may be made herein without departing from the spirit and scope of invention, and it is therefore aimed that the following claims cover all such modifications.

What is claimed as new and desired to be secured by Letters Patent of the United States is:

1. A two of n decoder for decoding a digital signal where n is the number of outputs of the decoder and is a function of the number of bits in the digital signal being decoded, comprising: first controllable means for precharging a first node to a first voltage potential; a plurality of second controllable means for controllably precharging each of the decoder outputs to a second voltage potential, the plurality of second controllable means being equal to n; a first plurality of transistors controllable by at least significant bit of the digital signal, the first plurality of transistors being equal to n-1; a second plurality of transistors coupled to the first plurality of transistors and controllable by a most significant bit of the digital signal, the second plurality of transistors being equal to two; and at least a third plurality of transistors coupled between the plurality of first and second transistors, the at least a third plurality of transistors being controllable by bits of the digital signal between the least and the most significant bits, the at least a third plurality of transistors being equal to n-1 divided by two, the first, second and third plurality of transistors being coupled in series between the first node and the outputs for forming a controllable path between the first node and a predetermined two of the outputs.

2. The decoder of claim 1 further including a plurality of pairs of back-to-back inverters each of the pairs coupled to one of the outputs to provide static outputs.

3. The decoder of claim 1 wherein the first controllable means is an N-channel field effect transistor, and the second controllable means are P-channel field effect transistors.

4. A two of n digital decoder for decoding a digital signal having a least significant bit and a most significant bit, the decoder providing n decoded outputs where n is a function of the digital signal being decoded, comprising: n field effect transistors of a first conductivity type to controllably precharge each of the outputs to a first voltage potential; a field effect transistor of a second conductivity type to controllably precharge a first node to a second voltage potential; a plurality of field effect transistors each controllable by a bit of the digital signal, the plurality of field effect transistors being coupled between the first node and the outputs to provide a controllable path between the first node and the outputs, the number of the plurality of transistors between every other output and the first node is equal to the number of bits in the digital signal and the number of the plurality of transistors between an output adjacent to every other output and the first node is equal to the number of bits in the digital signal minus one.

5. The decoder of claim 4 further including a pair of inverters coupled to each of the outputs in a back-to-back configuration.

6. A two of n digital decoder for decoding digital signals having at least a most significant and a least significant bit where n is the number of outputs of the decoder and is a function of the digital signal, comprising: a first plurality of transistors coupled between outputs of the decoder and a first potential node, the first plurality of transistors being for precharging the outputs of the decoder and being equal to n; a second plurality of transistors each coupled to a separate one of the outputs, the second plurality of transistors being equal to n-1 and arranged in pairs having a first and a second transistors, the first transistor of the pair being controllable by the least significant bit and the second transistor of the pair being controllable by the complement of the least significant bit, each transistor of the pair having a source electrode and the source electrodes of each pair being coupled together to form a plurality of first nodes; at least a third plurality of transistors each coupled to one of the first nodes and being controllable by bits of the digital signal which are between the least and the most significant bits, the third plurality of transistors being equal to n-1 divided by two and arranged in pairs, each pair having a first and second transistor and each transistor having a source electrode, the source electrodes of each pair being coupled together to form a plurality of second nodes; a last pair of transistors being controllable by the most significant bit, each transistor of the last pair having source electrodes coupled together to form a third node, the last pair of transistors being coupled between the third node and the second nodes; a precharging transistor coupled between the third node and a second potential node, the precharging transistor being for precharging the third node; and an output coupled to the first node to provide a two of n decoder where n is the number of outputs of the decoder.

7. The digital decoder of claim 6 further including a pair of inverters coupled to each of the outputs to provide a static output, the pair of inverters being arranged in a back-to-back configuration.

8. The digital decoder of claim 6 wherein the first plurality of transistors are P-channel field effect transistors and all other transistors are N-channel field effect transistors.

9. A two of n CMOS decoder, where n is equal to the number of outputs of the decoder, the decoder being capable of decoding a digital signal having a least and a most significant bit, comprising: a first transistor coupled between a first voltage potential node and a first node for precharging the first node; a first pair of transistors coupled between the first node and second and third nodes, the first pair of transistors being responsive to the most significant bit; at least a plurality of second pairs of transistors coupled between the second node and fourth and fifth nodes and coupled between the third node and sixth and seventh nodes, the plurality of second pairs of transistors being responsive to bits of the digital signal between the least and the most significant bits; a plurality of third pairs of transistors, each of the third pairs coupled to the fourth, fifth, sixth and seventh nodes, the plurality of third pairs of transistors being responsive to the least significant bit, each of the transistors of the third pairs having a drain and a source, the sources of each of the pairs forming an eighth node, each of the eighth nodes being connected to an output of the decoder, the drains being connected to other outputs of the decoder; and a plurality of precharging transistors being coupled between each of the outputs and a second voltage potential node to precharge the outputs.

10. The CMOS decoder of claim 9 further including a pair of inverters coupled to each of the outputs, the pair of inverters being arranged in a back-to-back configuration to provide a static output.

11. A two of n decoder for decoding digital signals having a least significant and a most significant bit, where n is equal to the number of decoder outputs, comprising: a plurality of first transistors coupled between the outputs and a first voltage node, each of the plurality of transistors being coupled to a separate one of the outputs; a plurality of first pairs of transistors being coupled to the outputs wherein each of the transistors has a source electrode, each of the first pairs of transistors having their source electrodes connected together and forming a first node, each first node being coupled to one of the decoder outputs; a plurality of second pairs of transistors each pair being coupled to one of the first nodes; at least a last pair of transistors coupled to the second pairs of transistors; and a precharging transistor coupled between the last pair of transistors and a second voltage potential node, the precharging transistor being for providing a precharge to the last pair of transistors.

12. The decoder of claim 11 further including a pair of inverters coupled to each of the outputs, the pair of inverters being arranged in a back-to-back configuration to provide a static output.

13. The decoder of claim 11 wherein the plurality of first pairs of transistors are responsive to the least significant bit and the last pair of transistors is responsive to the most significant bit.

* * * * *